(12) United States Patent
Koeppendoerfer et al.

(10) Patent No.: US 10,734,136 B2
(45) Date of Patent: Aug. 4, 2020

(54) CABLE WITH SHEATH ARRANGEMENT FOR DETECTING BENDING

(71) Applicants: Erwin Koeppendoerfer, Schwabach (DE); Bernd Janssen, Friesoythe (DE)

(72) Inventors: Erwin Koeppendoerfer, Schwabach (DE); Bernd Janssen, Friesoythe (DE)

(73) Assignee: LEONI KABEL GMBH, Nuremberg (DE)

( * ) Notice: Subject to any disclaimer, the term of this patent is extended or adjusted under 35 U.S.C. 154(b) by 80 days.

(21) Appl. No.: 16/031,510

(22) Filed: Jul. 10, 2018

(65) Prior Publication Data
US 2019/0027274 A1   Jan. 24, 2019

(30) Foreign Application Priority Data
Jul. 20, 2017   (DE) .......................... 10 2017 212 476

(51) Int. Cl.
| | | |
|---|---|---|
| H02G 3/04 | (2006.01) | |
| H01B 7/32 | (2006.01) | |
| G01R 31/58 | (2020.01) | |
| G01B 7/16 | (2006.01) | |
| G01M 5/00 | (2006.01) | |
| H01B 7/04 | (2006.01) | |
| H01B 7/17 | (2006.01) | |
| H01B 7/00 | (2006.01) | |
| G01R 1/06 | (2006.01) | |

(52) U.S. Cl.
CPC ................. *H01B 7/32* (2013.01); *G01B 7/18* (2013.01); *G01M 5/0041* (2013.01); *G01R 31/58* (2020.01); *H01B 7/04* (2013.01); *H01B 7/17* (2013.01); *G01R 1/06* (2013.01); *H01B 7/0054* (2013.01)

(58) Field of Classification Search
CPC ... H01B 7/32; H01B 7/04; H01B 7/17; H01B 7/0054; H01B 7/18; H01B 7/28; G01B 7/18; G01B 7/16; G01M 5/0041; G01R 31/021; G01R 1/06; G01R 31/58; H02G 3/04; H02G 3/0406
USPC ..... 174/68.1, 68.3, 72 A, 70 R, 34, 32, 70 C
See application file for complete search history.

(56) References Cited

U.S. PATENT DOCUMENTS

| | | | | |
|---|---|---|---|---|
| 4,739,801 A | * | 4/1988 | Kimura .................. | H02G 11/00 174/68.2 |
| 6,395,974 B1 | * | 5/2002 | Argaut ................ | G01R 31/021 174/21 R |

(Continued)

FOREIGN PATENT DOCUMENTS

| | | |
|---|---|---|
| EP | 1385177 | 1/2004 |
| GB | 2276766 | 5/1994 |

*Primary Examiner* — Angel R Estrada
(74) *Attorney, Agent, or Firm* — Tarolli, Sundheim, Covell & Tummino LLP

(57) ABSTRACT

The disclosure relates to a cable, which is adapted to extend in an initial configuration according to a predetermined initial state and in a deformed configuration to assume a deformed state compared with the initial state, wherein the cable has a sheath arrangement, which extends along a longitudinal axis of the cable at least in sections, wherein the sheath arrangement is adapted to change its impedance according to the initial or deformed configuration of the cable. The disclosure likewise relates to an arrangement comprising a cable and a measuring unit as well as a method for detecting a deformed configuration of a cable.

17 Claims, 3 Drawing Sheets

(56) References Cited

U.S. PATENT DOCUMENTS

| | | |
|---|---|---|
| 6,534,999 B2 | 3/2003 | Brown |
| 8,536,450 B2 * | 9/2013 | Aumoitte ............... H01B 9/028 174/36 |
| 8,692,116 B2 * | 4/2014 | Holland ............... H01B 7/0869 174/117 F |
| 8,953,915 B2 | 2/2015 | Sarchi et al. |
| 9,741,212 B2 | 8/2017 | Worzyk et al. |

* cited by examiner

CABLE WITH SHEATH ARRANGEMENT FOR DETECTING BENDING

RELATED APPLICATION

The present invention claims priority of DE 10 2017 212 476.8, filed on 20 Jul. 2017, the entirety of which is incorporated herein by reference.

TECHNICAL FIELD

The disclosure relates to a cable, which comprises a sheath arrangement, the impedance of which is variable according to a bending configuration of the cable. The disclosure further relates to an arrangement comprising such a cable as well as a measuring unit and a method for detecting a bending configuration of a cable.

It is known in the prior art that cables can only be deformed and bent, for example, to a certain extent. This is due to the fact that a small bending radius can damage the internal structure of the cable, above all when this is laid permanently with such a bending radius. The transmission quality by means of this cable can likewise be impaired. Even a stretching of the cable under tensile load constitutes a critical case of deformation. For individual cable types so-called minimal bending radii are therefore determined in advance, which indicate the extent to which the cable can be maximally bent. Limits for a permissible tensile load can also be determined.

It has proved to be the case however, that adherence to or not falling below such limit values can only be verified with difficulty. For example, it must hitherto be measured again in a laborious manner whether a cable actually remains above the minimum bending radius or not following its installation.

DISCLOSURE OF THE INVENTION

A need therefore exists to specify a solution with which a deformation state of a cable can be verified more easily.

The present disclosure provides a cable for this that is adapted to extend in an initial configuration according to a predetermined initial state and in a deformed configuration to assume a deformed state compared with the initial state. The deformed state can relate to an extension diverging from the initial state, for example an elongation or, expressed another way, a stretching and/or a bending. The cable can extend along a longitudinal axis, wherein the course of the longitudinal axis can define the extension of the cable. The cable can be configured to transmit power, data and/or light signals. The cable can generally be a power, data or fibre optic cable. The initial state can be assumed under its own weight, for example if the cable is kept freely suspended, so to speak, at one end under its own weight. The deformed state, on the other hand, can be assumed under manual or machine influence and/or if the cable is laid or installed according to an intended application.

The cable can comprise at least one conductor arrangement, for example to carry out the aforesaid transmissions. Furthermore, the cable can comprise at least one sheath arrangement (or, otherwise expressed, a sleeving), for example for the purpose of insulation and/or protection of any conductor arrangement.

The cable can include a sheath arrangement, which extends at least in sections along a longitudinal axis of the cable. The sheath arrangement can have a protective or insulation function as explained above and/or a shielding function as explained below. The sheath arrangement can comprise an electrically conductive material or be manufactured from this. The sheath arrangement can at least indirectly enclose any conductor arrangement or, expressed otherwise, at least indirectly incorporate it. The term "indirectly" in this context addresses any intermediate layers present between the sheath arrangement and the possible conductor arrangement. The sheath arrangement can be formed thin-walled and/or foil-like. The sheath arrangement can generally be manufactured from a material strand, which is wound, for example, around other components of the cable. A multipart formation is also conceivable, for example by providing individual segments of the sheath arrangement, which are lined up and/or connected to one another along the longitudinal axis.

The sheath arrangement can generally be configured to assume the initial configuration or deformed configuration together with the cable. In other words, the sheath arrangement can be bent and/or stretched together with the cable or any conductor arrangement of this.

The disclosure further provides that the sheath arrangement is adapted to change its impedance according to the initial configuration or the deformed configuration of the cable. The impedance can also comprise only an ohmic portion. As explained, the sheath arrangement can be bent and/or deformed together with the cable. Depending on the bending or deformation state, different impedances can then occur. The sheath arrangement can be configured structurally accordingly for this, for example by changing an interaction between adjacent regions or sections within the sheath arrangement, which can affect the impedance accordingly.

According to one variant the initial configuration can correspond to a linear configuration, in which the cable extends substantially in a straight line, and the deformed configuration can correspond to a bent configuration, in which the cable has a predetermined bending radius, at least in sections.

The linear configuration can be understood as a course of the cable and/or a cable longitudinal axis that has no bending radii or only large bending radii. This can refer only to one section of the cable or also to the entire cable or at least a predominant portion of its length. The bent configuration can be distinguished, however, by the assumption of significant and, for example, comparatively small bending radii, so that the cable longitudinal axis has a correspondingly curved or undulating course.

Another embodiment provides that the initial configuration corresponds to an unstretched configuration, in which the cable has an initial length, and the deformed configuration corresponds to a stretched configuration, in which the cable is stretched and extended to a predetermined degree, at least in sections. The unstretched configuration can be assumed, for example, under its own weight, whereas the stretched configuration can be achieved by exerting tensile forces. This can be relevant for cables, for example, of which any conductor arrangement and/or other components of which are elastically flexible when tensile forces are exerted. In this context the sheath arrangement can also be elastically elongated and thus assume a greater length.

It is understood that both variants can also be provided with regard to the deformed configuration. In other words, the sheath arrangement can be configured to change its impedance both according to a bending radius and also to stretching.

A further development provides that the sheath arrangement is adapted to increase its impedance on assuming the deformed configuration as compared to the initial configuration. However, it is also conceivable in principle that the sheath arrangement is adapted to reduce its impedance on assuming the deformed configuration as compared to the initial configuration.

The sheath arrangement can be adapted to assume a substantially closed state in the initial configuration and an at least locally open state in the deformed configuration. The closed state can refer to a substantially closed enveloping of the internal components of the cable arrangement. In other words, the sheath arrangement can define a substantially closed enveloping or outer surface. The local opening can be characterised by the temporary formation of openings, slots, holes or similar, for example in the enveloping or outer surface explained above and formed by the sheath arrangement.

The sheath arrangement can comprise at least two electrically conductive regions. These can be regions directly adjacent to, abutting and/or connected to one another when viewed along the cable longitudinal axis. The regions can be formed, for example, by adjacent turns of a sheath arrangement wound around other components of the cable and/or by adjacent and individual segments of the sheath arrangement lined up along the longitudinal axis. In other words, the electrically conductive regions can comprise, for example, adjacent turns or turn sections of the sheath arrangement or be formed by these.

The electrically conductive regions can be movable relative to one another according to a switch between the initial configuration and the deformed configuration. For example, they can be moved towards one another in a switch from the deformed configuration to the initial configuration and/or moved away from one another in a reverse switch. These movements can take place at least proportionally along the cable longitudinal axis.

According to one variant the electrically conductive regions are adapted to interact in an electrically conductive manner with one another to a greater extent in the initial configuration of the cable than in the deformed configuration. This can be achieved, for example, in that upon assuming the initial configuration they have a greater contact and/or interaction region than when assuming the deformed configuration. The contact and/or interaction region can be achieved by an overlap, at least in sections, of the regions along the cable longitudinal axis (see also explanation below).

In the deformed configuration of the cable, the electrically conductive regions can be arranged to be contact-free relative to one another, at least in sections. In other words, any contact and/or interaction region can be reduced in sections or completely in the deformed configuration or, expressed another way, can be liquidated. Figuratively speaking, the electrically conductive regions can be moved out of and away from one another in the deformed configuration. Any overlap of these regions in the initial configuration can be removed or, otherwise expressed, dissolved by this, at least in sections. As a consequence, the impedance can rise compared with the initial configuration on account of the at least locally no longer closed sheath arrangement.

In the initial configuration the electrically conductive regions can overlap one another along a longitudinal axial section of the cable. This can also be accompanied by direct contact of the regions. The contact and/or interaction region explained above can be formed by this. In the initial configuration the sheath arrangement can thus be substantially closed, which can result in reduced impedance. As explained, however, when assuming the deformed configuration the overlap can be removed and the sheath arrangement opened locally, due to which the impedance can increase accordingly.

The predetermined bending radius of the deformed (or of the bent) configuration can be a minimal bending radius of the cable. As explained in the introduction, the minimal bending radius can be determined in advance as a type of fixed parameter, in order to quantify the possible spectrum of use of the cable.

According to one embodiment the sheath arrangement can have a shielding function. For example, the sheath arrangement can be formed by a shielding foil or comprise such a foil. The shielding function can relate to shielding in relation to electrical and/or magnetic fields. These can act on the cable from outside and/or be directed by the cable itself into the environment.

The disclosure further relates to an arrangement, comprising a cable according to any one of the preceding aspects and a measuring unit, which is adapted to detect an electrical variable of the sheath arrangement. The measuring unit can be wired and can be supplied, for example, together with the cable and/or can be fitted onto this. Alternatively the measuring unit can be provided externally and only connected temporarily to the cable for the purpose of measurement. The measuring unit can be configured to monitor whether the electrical variable (for example, in the form of impedance) and/or an amount of change of this attains predetermined threshold values. At a higher level the measuring unit can be configured to emit alarm signals, for example if the aforesaid threshold values are reached or exceeded or are not reached.

Finally the disclosure relates to a method for detecting a deformed configuration of a cable, wherein the cable is configured optionally according to any one of the preceding aspects, comprising the steps:

changing of an initial configuration of the cable to a predetermined deformed configuration or vice versa;

parallel monitoring of an electrical variable of a sheath arrangement of the cable;

identification of the predetermined deformed configuration of the cable if the electrical variable attains a predetermined threshold value.

The method can comprise any other steps in order to provide all of the operational states or effects explained above or below. This can comprise, for example, a bending of the cable and/or stretching of the cable, in order to assume the deformed configuration. The method can be executed manually, automatically or partially automatically. For example, at least the last two of the steps listed above can be executed automatically by a measuring unit. However, the first method step according to the above list can be executed manually, but also automatically by a suitable actuator unit or testing station into which the cable is placed.

The relationship of the deformed configuration and the electrical variable can be determined in advance by simple experiments. The threshold value can correspond to a minimal bending radius. The method can be executed parallel to or during an installation process of the cable. In addition or alternatively, the method can be executed in order to verify that the sheath arrangement is free of faults, for example. If the predetermined threshold value is attained unexpectedly early or late, for example, this may indicate that the sheath arrangement is faulty.

The method can provide that the monitoring is carried out at least indirectly with reference to a receiver element, which is characterised by at least one electrical property, which is variable as a function of a deformation change of the cable.

The receiver element can be integrated into the cable or be part of a measuring arrangement separate from the cable. For example, the sheath arrangement can open locally as explained above in the context of the deformation. If a signal is transmitted via the cable at the same time or another electrical property of this is manipulated or adjusted in a predetermined manner, a corresponding interaction with the receiver element can occur due to the open sheath arrangement. For example, electrical or magnetic fields of the cable can act on the receiver element. This can be measured and/or monitored at the receiver element, whereupon a corresponding property change of the sheath arrangements and their local opening, for example, can be deduced indirectly.

By analogy with previous executions the electrical variable can be an impedance of the sheath arrangement.

Additional features of the invention will become apparent and a fuller understanding obtained by reading the following detailed description made in connection with the accompanying drawings.

BRIEF DESCRIPTION OF THE DRAWINGS

The present disclosure is to be explained further with reference to Figures. These Figures show schematically.

DETAILED DESCRIPTION

Specific details are described in the following, without being restricted to these, in order to supply a complete understanding of the present disclosure. However, it is clear to a person skilled in the art that the present disclosure can be used in other exemplary embodiments, which may diverge from the details stated below.

In FIGS. 1 to 4, cables 10 are shown according to two embodiments of the disclosure. The corresponding views each represent a sectional view of a cable section containing a longitudinal axis L of the cable 10 or, otherwise expressed, a longitudinal section of the cable 10.

Figure 1:
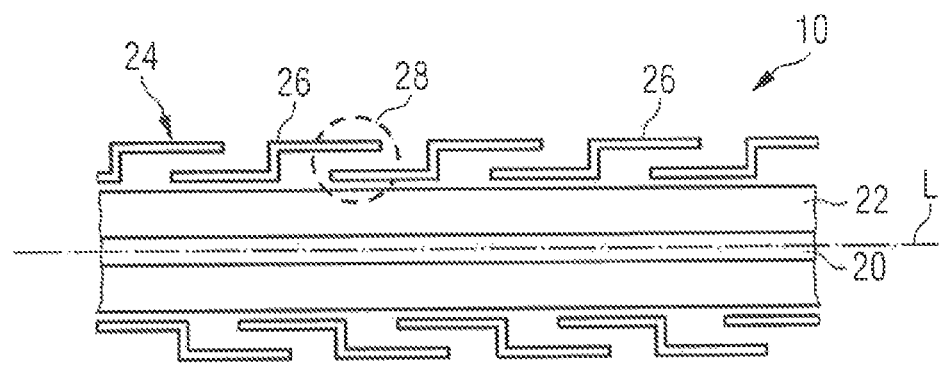
FIG. 1: a cable according to a first embodiment in a linear configuration.

FIG. 1 shows a section of a cable 10 according to a first embodiment. The cable 10 extends along a longitudinal axis L and has a substantially circular cross section. The cable comprises a central or, otherwise expressed, centric conductor arrangement 20, which coincides with the longitudinal axis L and determines its course. In the case shown, the conductor arrangement 20 is formed to transmit power. The conductor arrangement 20 is enclosed by an intermediate sheath 22. On its external circumferential surface lies a sheath arrangement 24, which has a shielding function in the example shown.

Put more precisely, the sheath arrangement 24 is formed by a shielding foil, which comprises individual Z-shaped segments 26, which are lined up along the longitudinal axis L. The Z-shaped segments 26 are formed in this case by adjacent turns of a material strip in the form of a shielding foil strip wound around the conductor arrangement 20 and the intermediate sheath 22. For representation reasons not all of the Z-shaped segments 26 in FIG. 1 are provided with a corresponding reference sign. The Z-shaped segments 26 each represent an electrically conductive region of the sheath arrangement 24 and are manufactured from a metallic material. An outer circumferential sheath, which encloses the sheath arrangement 24 and insulates the cable 10 electrically, is not shown.

In FIG. 1 the cable 10 is in a linear configuration, in which the longitudinal axis L has a substantially linear course. The same applies to the conductor arrangement 20, the intermediate sheath 22 and also the sheath arrangement 24, which can only be bent together if the configuration of the cable 10 is to be changed. The state shown thus corresponds to an undeformed initial configuration of the cable 10.

It is recognised that in this configuration adjacent segments 26 of the sheath arrangement 24 overlap, at least in sections. A corresponding overlap region 28 is indicated schematically in FIG. 1 for an adjacent pair of segments 26. In this state the sheath arrangement 24 thus assumes a closed state, in which it forms a substantially closed outer envelope around the conductor arrangement 20 and the intermediate sheath 22.

Even if this is not shown in the schematic representation in FIG. 1, the adjacent segments 26 can even directly abut one another and contact one another in the overlap region 28. The overlap region 28 can thus define a contact region between the adjacent segments 26. As a whole an increased electrical conductivity of the sheath arrangement 24 is guaranteed by the overlap of the adjacent segments 26, which results in a comparatively low impedance.

Figure 2:
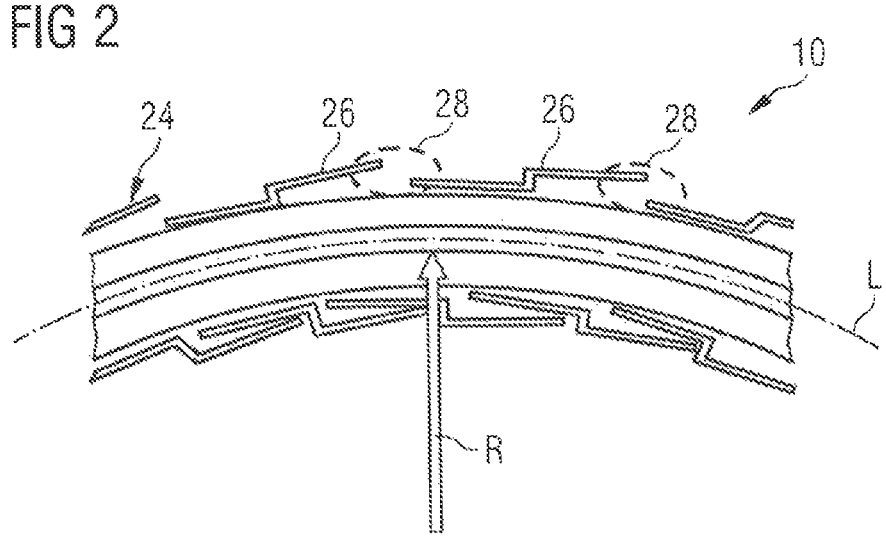
FIG. 2: the cable from FIG. 1 in a bent configuration.

In FIG. 2, however, the cable 10 is shown in a bent and thus deformed configuration. In this state the longitudinal axis L has a curved or, expressed another way, bent course. A resulting bending radius R is likewise schematically indicated in FIG. 2. It is recognised that the conductor arrangement 20 and the intermediate sheath 22 substantially follow the course of the longitudinal axis L. Viewed macroscopically this also applies to the sheath arrangement 24. However, due to the bending of the cable 10, the adjacent segments 26 of the sheath arrangement 24 shift relative to one another.

It is specifically recognised that on the inner side of the cable 10 in FIG. 2 the adjacent segments 26 are moved towards one another. The extent of the overlap of these segments 26 thus increases.

On the outer side of the cable 10 in FIG. 2, however, the segments 26 are pulled apart. It is recognised that in the original overlap region 28 an actual overlap is consequently actually no longer present and in particular contact no longer exists between the adjacent segments 26. Instead of this, these are arranged contact-free relative to one another, at least on the outer side of the cable 10. This means that the sheath arrangement 24 is opened section-wise or locally, so to speak. In consequence the impedance of the sheath arrangement 24 increases significantly compared with the linear configuration in FIG. 1.

This can be detected by a measuring unit, which is not shown. A bending radius R that is present can also be deduced from the detected value of the impedance. For example, the attainment of a threshold value can be detected, which corresponds to a minimal bending radius R of the cable arrangement 10. In this case the measuring unit can also generate an alarm signal. Suitable measuring methods that can be cited are so-called time-domain reflectometry (TDR, also abbreviated to VVTT) or return loss with vector analyser (VNA).

Figure 3:
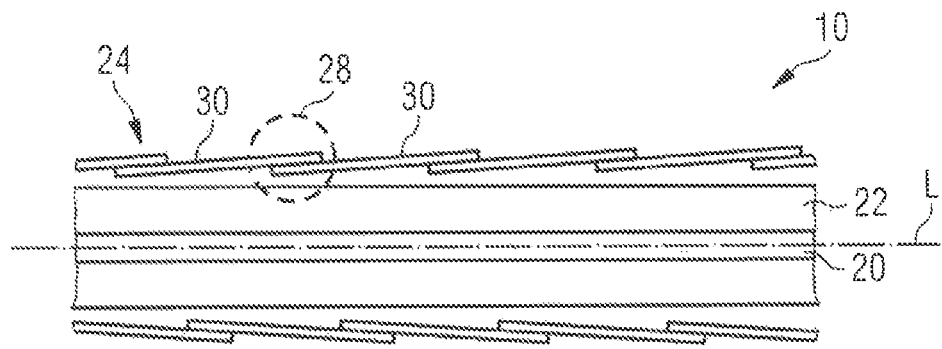
FIG. 3: a cable according to a second embodiment in a linear configuration.
Figure 4:
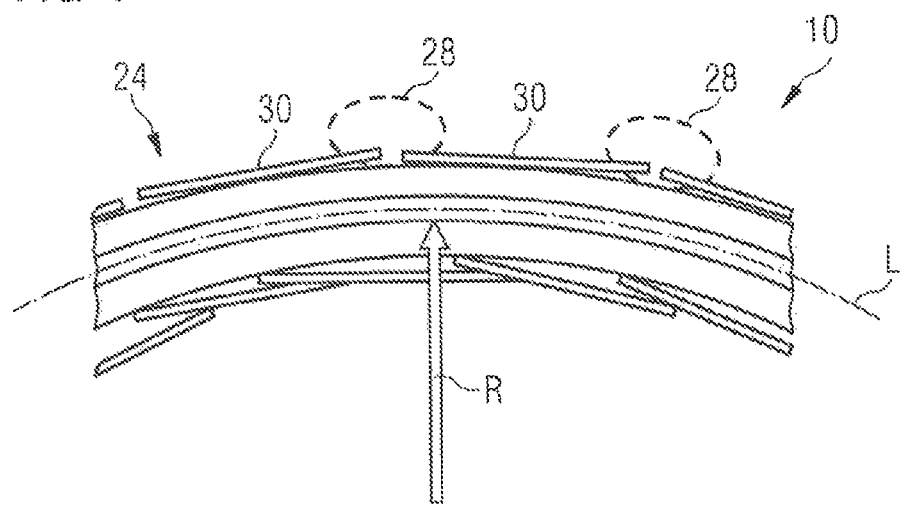
FIG. 4: the cable from FIG. 3 in a bent configuration.

FIGS. 3 and 4 show an alternative embodiment of a cable 10. Similar features or features having the same effect are provided here with the same reference signs.

The embodiment in FIGS. 3 and 4 differs from the previous embodiment only in respect of the design of the sheath arrangement 24, wherein the sheath arrangement 24 again has a shielding function. In this case specifically the sheath arrangement 24 is wound around the electrical conductor arrangement 20 and the intermediate sheath 22. Regions 30 are again formed by this, which are adjacent to one another when viewed along the longitudinal axis L and which each comprise a turn region.

In the linear configuration in FIG. 3, the adjacent regions 30 overlap and contact one another along the longitudinal axis L in an overlap region 28. The sheath arrangement 24 in the linear configuration consequently assumes a substantially closed state once again.

However, if the cable 10 is bent according to the representation in FIG. 4, the adjacent regions 30 on the side lying externally in FIG. 4 are moved away from one another, so that in the original overlap regions 28 no further contact or overlap of any kind exists. Thereupon the impedance increases again on account of this locally open state of the sheath arrangement 24, which is detectable in turn in the manner explained above by a measuring unit, which is not shown.

In both embodiments the extent of the overlap in the linear configuration and thus the initial impedance prior to a deformation can be determined, for example, by way of a pitch or foil width of the sheath arrangement 24.

Finally it should be mentioned that an analogous principle can be used also to detect the stretching of a cable 10. If the conductor arrangement 20 and the intermediate sheath 22 in the embodiment in FIG. 1 are formed to be elastically flexible, for example, a deformed state can also be attained by exerting a corresponding tensile force on the cable 10. In this case also the adjacent regions 30 of the sheath arrangement 24 can be pulled away from one another, so that an initial overlap within the overlap regions 28 can be removed. This is accompanied in turn by an increase in impedance, which is again detectable via a measuring unit. The deformed state thus corresponds to a stretched and lengthened state of the cable 10 in this case.

Figure 5:
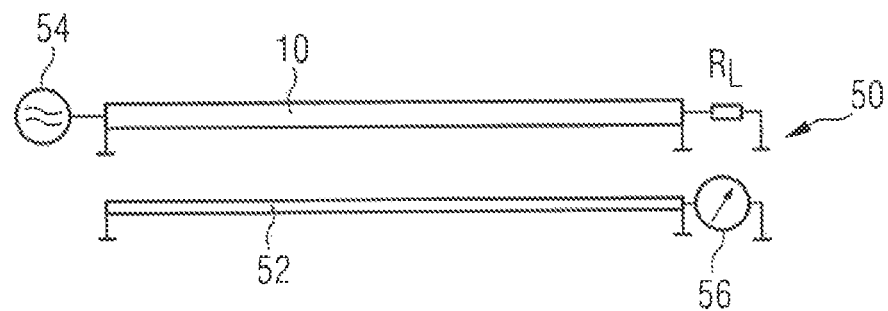
FIG. 5: a measuring arrangement for detecting the bending configuration according to a first embodiment.
Figure 6:
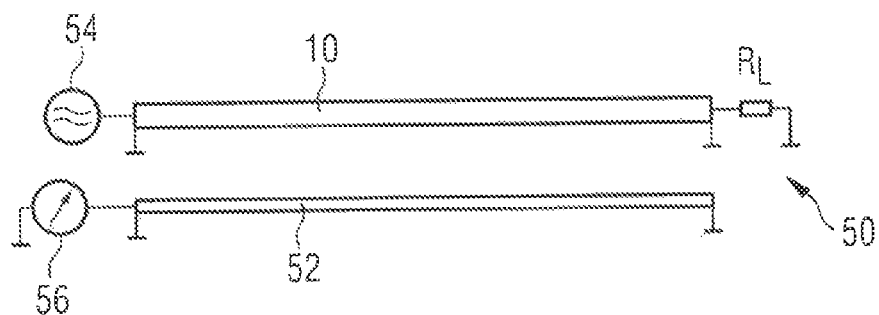
FIG. 6: a measuring arrangement for detecting the bending configuration according to a second embodiment.

FIGS. 5 and 6 show embodiments of a measuring arrangement 50, with which a measuring method according to the present disclosure can be executed to determine a bending configuration of a cable 10. The cable 10 can be formed in this case according to any of the embodiments explained above. As explained below, a change in an electrical variable of the cable 10 and in particular a change in the impedance of the sheath arrangement 24 is detected indirectly via a separate receiver element 52 in the measuring method.

To this end the cable 10 in both embodiments is connected to a signal generator unit 54, which is coupled to the conductor arrangement 20, which is not shown in FIGS. 5 and 6. The signal generator unit 54 can be a simple sinus generator for a few megahertz. However, other signal forms are also conceivable. The receiver element 52 extends parallel to the cable 10. This element is configured to enter into interaction with the cable 10 and thereupon to experience its own electrical magnitude. The receiver element 52 can be a separate wire and, for example, an insulated wire. This can optionally also be integrated directly into the cable 10. In addition or alternatively, the receiver element 52 can be formed by analogy with the cable 10 and deformable together with this, for example in order to be able to have a sheath arrangement 24 that is likewise open in predetermined bending states.

In detail the cable 10 is deformed according to the present method by analogy with FIGS. 2 and 4 above, whereupon the initially shielding sheath arrangement 24 opens. In consequence the signals transmitted to the conductor arrangement 20 in the form of electrical and/or magnetic fields can emerge and enter into interaction with the receiver element 52. This can then likewise experience an electrical variable change, which is detectable in turn via a receiver measuring unit 56 coupled to the receiver element 52.

A change in the impedance of the sheath arrangement 24 of the cable 10 can be detected indirectly, so to speak, in this way and in particular the attainment of a threshold value, from which a predetermined bending state can be deduced.

It should be noted that the measuring arrangement according to FIG. 5 is based on a far end crosstalk principle (FEXT). The measuring arrangement according to FIG. 6 is based on the other hand on a near end crosstalk principle (NEXT). In the latter case the approximate location of the malfunction or opening of the sheath arrangement 24 can also be determined depending on the frequency by way of an additional phase measurement. In both cases an extent of the signal level measured is a function of the line length and the attenuation per unit length.

Another embodiment provides that, for example, in the context of integration into a common cable arrangement, the receiver element 52 and the cable 10 in FIG. 5 or 6 are enclosed by a common shield that is resistant to bending. The crossing of signals to other elements can be prevented by this.

Although the invention has been described with a certain degree of particularity, those skilled in the art can make various changes to it without departing from the spirit or scope of the invention as hereinafter claimed.

The invention claimed is:

1. A cable,
   which extend in an initial configuration according to a predetermined initial state and in a deformed configuration assume a deformed state compared with the initial state,
   wherein the cable has a sheath arrangement, which extends at least in sections along a longitudinal axis of the cable,
   wherein the sheath arrangement change its impedance according to the initial configuration or the deformed configuration of the cable, said change in impedance being monitored by a measuring unit.

2. A cable according to claim 1,
   wherein the initial configuration corresponds to a linear configuration, in which the cable extends substantially in a straight line, and the deformed configuration corresponds to a bent configuration, in which the cable has a predetermined bending radius, at least in sections.

3. A cable according to claim 1,
   wherein the initial configuration corresponds to an unstretched configuration, in which the cable has an initial length, and the deformed configuration corresponds to the stretched configuration, in which the cable is stretched and lengthened to a predetermined extent, at least in sections.

4. A cable according to claim 1,
   wherein the sheath arrangement increase its impedance on assuming the deformed configuration as compared to the initial configuration.

5. A cable according to claim 1,
wherein the sheath arrangement assume a substantially closed state in the initial configuration and an at least locally open state in the deformed configuration.

6. A cable according to claim 1,
wherein the sheath arrangement comprises at least two electrically conductive regions, and
wherein the electrically conductive regions comprise, for example, adjacent turns or turn sections of the sheath arrangement.

7. A cable according to claim 6,
wherein the electrically conductive regions are movable relative to one another according to a switch between the initial configuration and the deformed configuration.

8. A cable according to claim 6,
wherein the electrically conductive regions interact electrically conductively with one another to a greater extent in the initial configuration of the cable than in the deformed configuration.

9. A cable according to claim 8,
wherein the electrically conductive regions are arranged contact-free relative to one another, at least in sections, in the deformed configuration of the cable.

10. A cable according to claim 6,
wherein the electrically conductive regions overlap one another along a longitudinal axial section of the cable in the initial configuration.

11. A cable according to claim 2,
wherein the predetermined bending radius of the bent configuration is a minimal bending radius of the cable.

12. A cable according to claim 1,
wherein the sheath arrangement has a shielding function.

13. An arrangement,
comprising a cable which extend in an initial configuration according to a predetermined initial state and in a deformed configuration is adapted to assume a deformed state compared with the initial state,
wherein the cable has a sheath arrangement, which extends at least in sections along a longitudinal axis of the cable,
wherein the sheath arrangement change an electrical variable of the sheath arrangement according to the initial configuration or the deformed configuration of the cable;
and a measuring unit, which detect an electrical variable of the sheath arrangement.

14. A method according to claim 13,
wherein the electrical variable is an impedance of the sheath arrangement.

15. A method for detecting a deformed configuration of a cable,
wherein the cable is formed optionally as a cable,
which extend in an initial configuration according to a predetermined initial state and in a deformed configuration assume a deformed state compared with the initial state,
wherein the cable has a sheath arrangement, which extends at least in sections along a longitudinal axis of the cable,
wherein the sheath arrangement change an electrical variable of the sheath arrangement according to the initial configuration or the deformed configuration of the cable,
comprising the steps:
changing an initial configuration of the cable to a predetermined deformed configuration or vice versa;
parallel monitoring of an electrical variable of a sheath arrangement of the cable;
identification of the predetermined deformed configuration of the cable if the electrical variable attains a predetermined threshold value.

16. A method according to claim 15,
wherein the monitoring takes place at least indirectly with reference to a receiver element, which is characterised by at least one electrical property, which is variable as a function of a deformation change of the cable.

17. A method according to claim 15,
wherein the electrical variable is an impedance of the sheath arrangement.

* * * * *